United States Patent
Göbel et al.

(10) Patent No.: US 6,180,992 B1
(45) Date of Patent: Jan. 30, 2001

(54) FUSE CONFIGURATION FOR A SEMICONDUCTOR STORAGE DEVICE

(75) Inventors: Holger Göbel, Hamburg; Gunnar Krause, München, both of (DE)

(73) Assignee: Infineon Technologies AG, Munich (DE)

( * ) Notice: Under 35 U.S.C. 154(b), the term of this patent shall be extended for 0 days.

(21) Appl. No.: 09/143,122

(22) Filed: Aug. 28, 1998

(30) Foreign Application Priority Data

Aug. 28, 1997 (DE) ................................. 197 37 611

(51) Int. Cl.$^7$ ...................................................... H01L 29/00
(52) U.S. Cl. ............................................................. 257/529
(58) Field of Search ................................ 257/529, 209

(56) References Cited

U.S. PATENT DOCUMENTS

| | | |
|---|---|---|
| 3,863,231 | 1/1975 | Taylor . |
| 4,454,002 | 6/1984 | Hankins . |
| 4,667,310 * | 5/1987 | Takada ................................. 365/154 |
| 4,920,075 * | 4/1990 | Morita ................................... 257/529 |
| 5,159,661 | 10/1992 | Ovshinsky et al. . |
| 5,244,836 | 9/1993 | Lim . |
| 5,545,904 * | 8/1996 | Orbach ................................. 257/529 |

FOREIGN PATENT DOCUMENTS 38 17 137 A1  12/1988  (DE) .

* cited by examiner

*Primary Examiner*—J. Carroll
(74) *Attorney, Agent, or Firm*—Herbert L. Lerner; Laurence A. Greenberg; Werner H. Stemer

(57) ABSTRACT

A fuse configuration for a semiconductor storage device has a multiplicity of fuses on a semiconductor body. The fuses are disposed in two or more planes so as to save chip area. The fuses are programmed individually by melting and thus breaking certain conducting connections. The fuses may be fused by crossing two laser beams and melting the fuse at which the beams cross.

4 Claims, 1 Drawing Sheet

FUSE CONFIGURATION FOR A SEMICONDUCTOR STORAGE DEVICE

BACKGROUND OF THE INVENTION

FIELD OF THE INVENTION

The invention belongs into the semiconductor technology field. More specifically, the invention pertains to a fuse link configuration for a semiconductor storage device, having a multiplicity of fuses which are provided on a semiconductor body and can each be programmed individually through the injection of energy to break or make a conducting connection.

It is well-known to use fuses for the permanent storage of data in semiconductor storage devices and for programming the redundancy in semiconductor storage devices of this type. In the former case, the state of the fuse ("conducting" or "nonconducting") establishes a data value ("0" or "1"), while in the latter case, if there is a defective storage cell, a redundant storage cell is connected into the circuit by activating the fuse.

Fuses generally consist of, for example, polycrystalline silicon or a similar suitable material that can be fused or melted through the action of energy, by means of which a previously existing conducting connection is broken. It is, however, also conceivable to use a material which is converted by the action of energy from the nonconducting state to the conducting state, in order thus to create a conducting connection. It will nevertheless be assumed below that a previously existing conducting connection will be destroyed by the action of energy.

The action of energy may be brought about, for example, by irradiating a fuse with a laser beam, or else simply by passing a relatively heavy current through a particular fuse, in order to cause it to melt.

Contemporary fuse configurations use fuses which are arranged next to one another, for example in the form of a matrix, on the surface of the semiconductor body, or chip, of a semiconductor storage device. As the number of fuses rises, that is to say as the storage capacity of the semiconductor storage device increases, the overall effect is that the required area of the chip becomes ever greater.

In order to keep the required area as small as possible, attempts have to date been made to design the fuses as small as possible in geometric terms. However, that procedure is limited by the fact that, when the fuse is activated or programmed, i.e. for example when the fuses are illuminated with a laser beam, a minimum mutual separation of the individual fuses must be respected so that the desired fuse can deliberately and reliably be melted by the laser beam.

SUMMARY OF THE INVENTION

It is accordingly an object of the invention to provide a fuse configuration for a semiconductor, which overcomes the above-mentioned disadvantages of the prior art devices and methods of this general type and which is distinguished by a considerably reduced area requirement, yet in which individual fuses can be activated deliberately and reliably.

With the foregoing and other objects in view there is provided, in accordance with the invention, a fuse configuration in a semiconductor storage device, comprising a semiconductor body and a multiplicity of fuses disposed in the semiconductor body, the fuses being arranged in at least two planes and being programmable by a superposition of at least two laser beams crossing at a respective fuse to be programmed.

In other words, the objects of the invention are satisfied with a fusible link configuration disposed in at least two planes on the semiconductor body. The fuses may be arranged above one another in several, say, n planes. The area required by the fuses on the semiconductor body is therefore reduced approximately by a factor n, if the wiring for connecting the fuses is disregarded.

In accordance with an added feature of the invention, an insulating layer is disposed between the planes of the fuses. The insulator is preferably silicon dioxide.

In accordance with another feature of the invention, the fuses consist of polycrystalline silicon. The polycrystalline silicon links can be melted by passing a current through them or by superimposed action of at least two laser beams, in order thus to activate (or deactivate) the fuses. The two acting laser beams then cross at the fuse to be activated.

Accordingly, there is also provided, in accordance with the invention, a method of programming a semiconductor memory, which comprises:

forming a multiplicity of fuse links in at least two mutually parallel planes in a semiconductor body, and separating the fuse links from one another with an electrical insulator;

irradiating a selected fuse link with at least two laser beams and melting the selected fuse link by crossing the laser beams at the selected fuse link.

Where several fuse planes are arranged above one another, the fuses can be programmed either by a specific current, which causes the material to melt, or alternatively by the superimposition of several laser beams. The intensity of the laser beams should be chosen such that just a single beam will not damage the material; however, if a plurality of beams are superimposed at one point (the location of the fuse to be programmed), then the local energy intensity will become great enough for the fuse to be destroyed.

Other features which are considered as characteristic for the invention are set forth in the appended claims.

Although the invention is illustrated and described herein as embodied in a fuse configuration for a semiconductor storage device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing figure.

DESCRIPTION OF THE PREFERRED EMBODIMENTS

Figure 1:
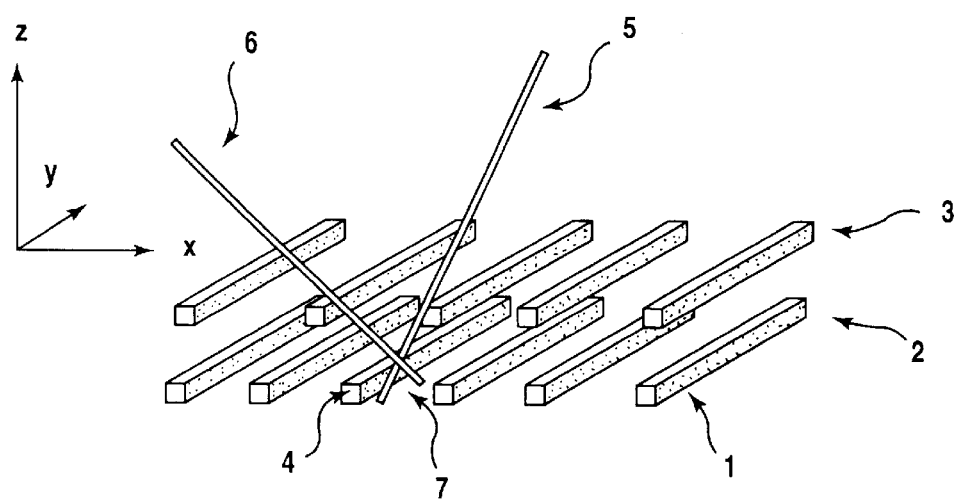
FIG. 1 is a perspective view of a fuse configuration in two planes, with a separating insulator layer having been omitted for purposes of clarity.
Figure 2:
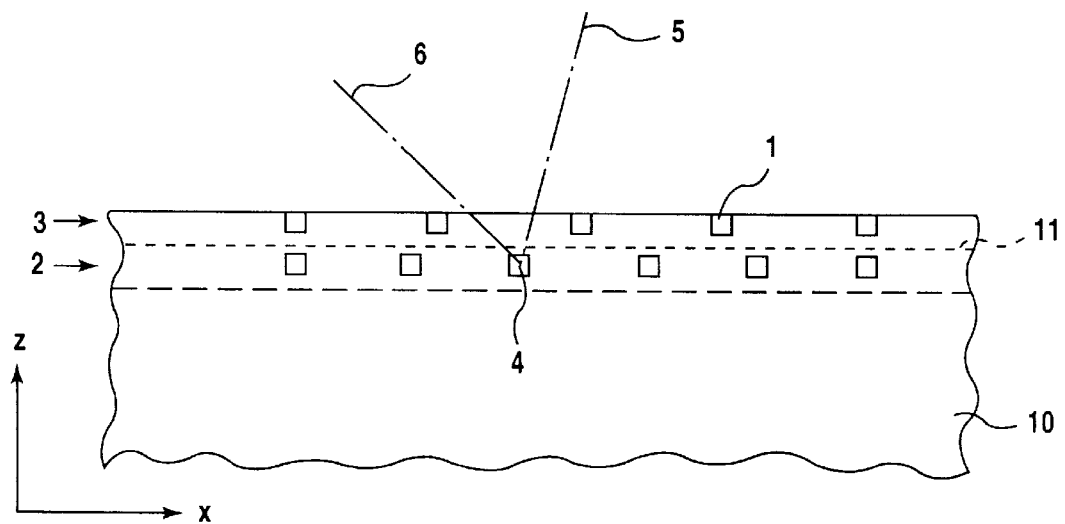
FIG. 2 is a partial sectional view through a semiconductor body and the fuse configuration.

Referring now to the figures of the drawing in detail, there is seen a plurality of polycrystalline silicon fuses 1. The fuses are arranged in two planes 2, 3 above one another in the z direction on a surface of a semiconductor body 10. The fuses extend in the x-y plane, of the semiconductor body 10 and they are separated from one another by a silicon dioxide insulator layer.

A fuse 4 to be programmed is exposed to two laser beams 5, 6 which cross at a point 7 in the region of the fuse 4. The fuse 4 is thereby melted and thus broken. The energy of the laser beams 5, 6 is adjusted such that one beam alone cannot cause any melting, and this ensures that only the fuse 4 where the laser beams 5, 6 cross is deliberately destroyed, while the other fuses 1 remain undamaged.

As an alternative to the intersecting laser beams 5, 6, it is also possible to pass a current through the fuse 4, such that this fuse 4 is melted and therefore destroyed.

We claim:

1. A fuse configuration in a semiconductor device, comprising:

a semiconductor body;

a multiplicity of fuses disposed in said semiconductor body, said fuses being arranged in at least two planes and being programmable by a superposition of at least two laser beams crossing at a respective fuse to be programmed wherein an energy of each of said at least two laser beams is adjusted such that only the superposition of the at least two laser beams results in a destruction of a fuse.

2. The fuse configuration according to claim 1, which further comprises an insulating layer disposed between said planes of said fuses.

3. The fuse configuration according to claim 2, wherein said insulator layer consists of silicon dioxide.

4. The fuse configuration according to claim 1, wherein said fuses consist of polycrystalline silicon.

* * * * *